US009007245B2

(12) United States Patent
Kimura et al.

(10) Patent No.: US 9,007,245 B2
(45) **Date of Patent: *Apr. 14, 2015**

(54) SEMICONDUCTOR DEVICE HAVING ANALOG-TO-DIGITAL CONVERTER WITH GAIN-DEPENDENT DITHERING AND COMMUNICATION APPARATUS

(71) Applicant: Renesas Electronics Corporation, Kawasaki-shi, Kanagawa (JP)

(72) Inventors: Keisuke Kimura, Kanagawa (JP); Yuichi Okuda, Kanagawa (JP); Hideo Nakane, Kanagawa (JP); Takaya Yamamoto, Kanagawa (JP); Tatsuji Matsuura, Kanagawa (JP)

(73) Assignee: Renesas Electronics Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/445,682

(22) Filed: Jul. 29, 2014

(65) Prior Publication Data

US 2014/0333461 A1 Nov. 13, 2014

Related U.S. Application Data

(63) Continuation of application No. 13/940,819, filed on Jul. 12, 2013, now Pat. No. 8,823,565.

(30) Foreign Application Priority Data

Jul. 23, 2012 (JP) ................................. 2012-162799

(51) Int. Cl.
*H03M 1/20* (2006.01)
*H03M 3/00* (2006.01)

(52) U.S. Cl.
CPC ................ *H03M 3/49* (2013.01); *H03M 1/201* (2013.01); *H03M 3/328* (2013.01); *H03M 3/332* (2013.01); *H03M 3/43* (2013.01); *H03M 3/438* (2013.01); *H03M 3/486* (2013.01)

(58) Field of Classification Search
CPC ....... H03M 3/328; H03M 3/332; H03M 3/43; H03M 3/438; H03M 3/486; H03M 3/49
USPC ......................................... 341/131, 118, 139
See application file for complete search history.

(56) References Cited

U.S. PATENT DOCUMENTS 5,493,298 A 2/1996 Bartz
6,462,685 B1 10/2002 Korkala

*Primary Examiner* — Jean B Jeanglaude
(74) *Attorney, Agent, or Firm* — Womble Carlyle Sandridge & Rice, LLP

(57) ABSTRACT

A semiconductor communication device reduces influence of noise that is produced by applying a dither signal. The semiconductor communication device includes a Delta-Sigma analog-to-digital converter that converts input analog signals to digital signals, a power detecting unit that detects signal power of the digital signals, a gain control unit that changes a gain setting of analog signals to be input to the Delta-Sigma analog-to-digital converter depending on the signal power of the digital signals, and a dither signal control unit that causes the Delta-Sigma analog-to-digital converter to selectively add the dither signal when the gain setting changes.

13 Claims, 7 Drawing Sheets

10
20
21
22
23
24
25
26
27
28
29
30
70
POWER DETECTING UNIT
GAIN CONTROL UNIT
DITHER SIGNAL CONTROL UNIT
DIGITAL BASEBAND LSI
gain_update
$G_{PGD}$
$G_{PGA}$
$G_{LNA}$ g_min
g_1
g_6
g_max
ADC Input Signal Amplitude (mVppd)
10000
1000
100
10
1
0.1
Rx Input Signal Power (dBm)
-120
-110
-100
-90
-80
-70
-60
-50
-40
-30
-20
-10

41
42
43
1/S
44
45
1/S
46
47
48
49
DAC
50
DITHER SIGNAL GENERATING CIRCUIT out
54
Q
D
55
53
Q
D
52
Q
D
51
Q
D
clk 10
60
21
22
23
24
25
26
27
29
GAIN CONTROL UNIT
30
DITHER SIGNAL CONTROL UNIT
gain_update
DIGITAL BASEBAND LSI
POWER DETECTING UNIT
71
70

SEMICONDUCTOR DEVICE HAVING ANALOG-TO-DIGITAL CONVERTER WITH GAIN-DEPENDENT DITHERING AND COMMUNICATION APPARATUS

CROSS-REFERENCE TO RELATED APPLICATIONS

This is a Continuation of U.S. patent application Ser. No. 13/940,819, filed Jul. 12, 2013, now U.S. Pat. No. 8,823,565, which claims priority to Japanese Patent Application No. 2012-162799 filed Jul. 23, 2012. The contents of the above-identified applications are incorporated by reference in their entirety.

BACKGROUND

The present invention relates to a semiconductor device and can suitably be used for, for example, a semiconductor device having a built-in an analog-to-digital converter.

A radio frequency circuit (RFIC) is equipped with an ADC (Analog to Digital Converter) for converting received analog signals to digital signals. The ADC is used to digitize an interface between the RFIC and a digital baseband LSI. As the ADC, for example, a Delta-Sigma ADC is used. In the case of the Delta-Sigma ADC, it is known that, when the amplitude of an input signal is small, for example, less than 10 mVppd, a spurious tone which is called an idle tone is generated. The idle tone deteriorates communication characteristics of the RFIC. Thus, in order to reduce the idle tone, a method of applying a dither signal to the Delta-Sigma ADC is known.

In Patent Document 1, there is disclosed a control method that detects the amplitude of an input signal to the ADC and changes the amount of dither signal to be applied to the ADC.

RELATED ART DOCUMENT

Patent Document

[Patent Document 1] Japanese Published Unexamined Patent Application No. 2002-314426

SUMMARY

However, in a case where the dither signal is applied to the ADC in such a way as to change the amount of dither signal depending on the detected amplitude of an input signal to the ADC, as in Patent Document 1, there is a possibility that an unpredictable noise is produced in timing of the application of the dither signal. In consequence, there is a possibility to deteriorate a receiving characteristic for incoming signals. Other problems addressed by the present invention and its novel features will become apparent from the following description in the present specification and the accompanying drawings.

According to one embodiment, a semiconductor device is configured such that an analog-to-digital converter is caused to add the dither signal in timing when a gain setting of analog signals to be input to the analog-to-digital converter changes.

According to the one embodiment above, the semiconductor device is capable of eliminating influence of noise that is produced by applying the dither signal.

DETAILED DESCRIPTION

First Embodiment

Figure 1:
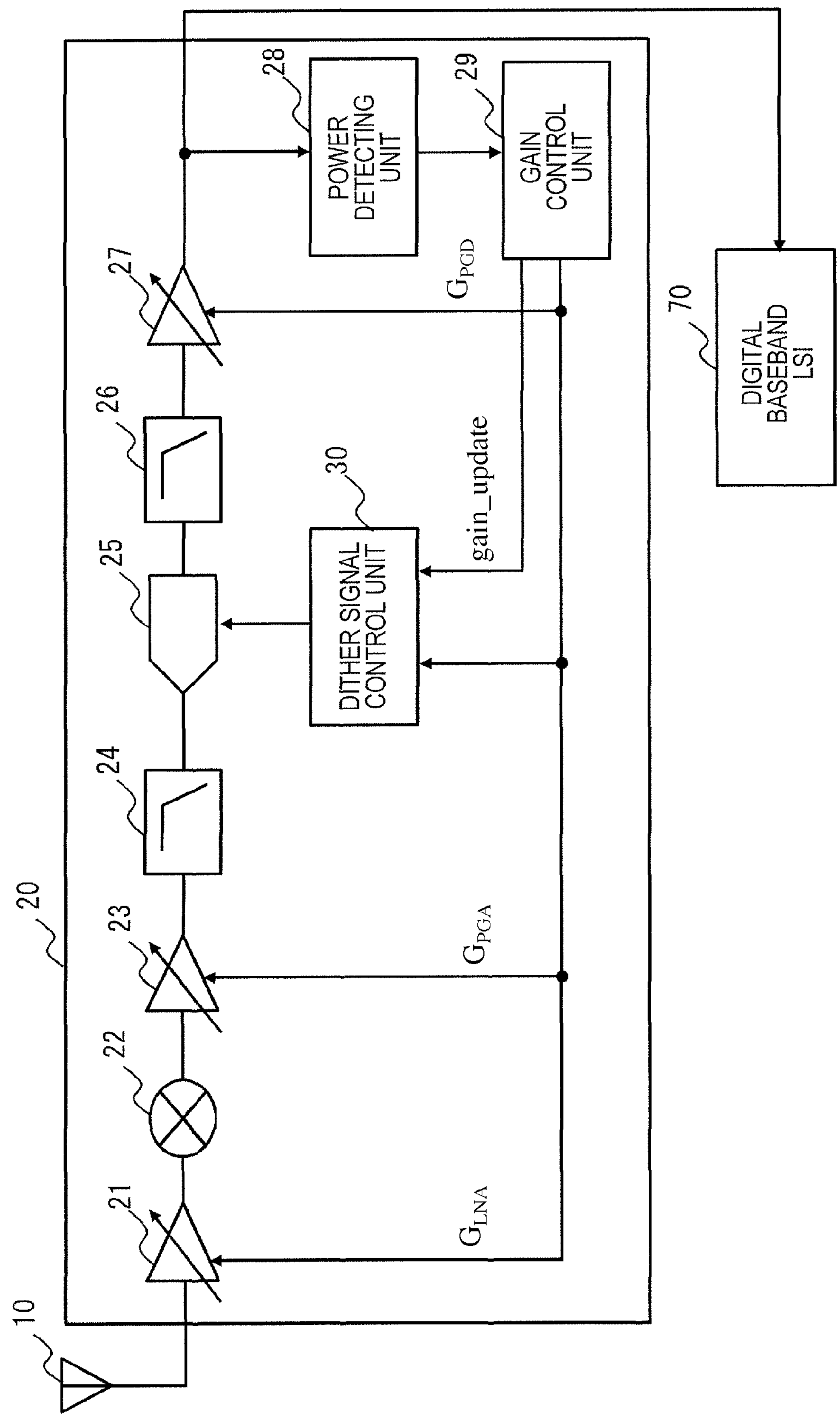
FIG. 1 is a configuration diagram of a radio circuit pertaining to a first embodiment.

In the following, embodiments will be described with reference to the drawings. A configuration example of a radio circuit (RFIC) 20 pertaining to a first embodiment is described using FIG. 1. The RFIC 20 is configured through the use of a semiconductor device. The RFIC 20 converts a radio signal received through an antenna 10 to a digital signal. The RFIC 20 includes an LNA (Low Noise Amplifier) 21, a MIX 22, a PGA (Programmable Gain Amplifier) 23, an LPF (Low Pass Filter) 24, a Delta-Sigma ADC 25, an LPF 26, a PDG (Programmable Digital Gain) 27, a power detecting unit 28, a gain control unit 29, and a dither signal control unit 30.

The LNA 21 amplifies radio signals which have been input through the antenna 10. The radio signals input through the antenna 10 are analog signals. The radio signals input through the antenna 10 may include a weak radio signal like the one with received signal power of −100 dBm. Thus, it is needed to amplify the radio signals so that signal processing can be performed in the RFIC 20. At this point, with the amplification of the radio signals, noise produced from an amplifying device is also amplified. Hence, as the device amplifying the radio signals, the LNA 21 producing less noise is used. The LNA 21 outputs amplified radio signals to the MIX 22.

The MIX 22 multiplies each of analog signals which have been output from the LNA 21 by an LO (Local Oscillator) signal. By multiplying each of the analog signals by the LO signal, the MIX 22 converts the signal frequency and generates baseband signals. The MIX 22 outputs the baseband signals to the PGA 23.

The PGA 23 amplifies the baseband signals output from the MIX 22 up to a predetermined adequate signal level. That is, the PGA 23 amplifies the amplitude of the baseband signals output from the MIX 22 up to a predetermined adequate value. The PGA 23 outputs the amplified baseband signals to the LPF 24.

The LPF 24 eliminates signals having frequencies beyond a predetermined frequency band. That is, the LPF 24 only allows passage of received signals within a desired frequency band and eliminates interfering waves outside of the desired frequency band. The LPF 24 outputs the received baseband signals within the desired frequency band to the Delta-Sigma ADC 25.

The Delta-Sigma ADC 25 converts the baseband signals output from the LPF 24 to digital signals. The baseband signals output from the LPF 24 are analog signals. Moreover, the Delta-Sigma ADC 25 adds the dither signal to the baseband signals output from the LPF 24 according to a dither on/off switching control signal that is output from the dither signal control unit 30. The dither on/off switching control signal is a control signal that specifies whether or not to add the dither signal in the Delta-Sigma ADC 25. For instance, if the dither on/off switching control signal is set to ON, the dither signal is added in the Delta-Sigma ADC 25. If the dither on/off switching control signal is set to OFF, the dither signal is not added in the Delta-Sigma ADC 25.

The Delta-Sigma ADC 25 may include the dither signal generating unit or the like (not depicted) that generates the dither signal. Alternatively, the Delta-Sigma ADC 25 may add the dither signal which is output from the dither signal generating unit disposed outside the Delta-Sigma ADC 25 to the baseband signals. The Delta-Sigma ADC 25 outputs digital signals to the LPF 26.

The dither signal may be an AC dither having an AC component, a DC dither having a DC component, or an offset signal which is set to a fixed value, among others. Alternatively, the dither signal may be a random signal or the like which can have a plurality of different values for a given period.

The LPF 26 receives digital signals output from the Delta-Sigma ADC 25. The LPF 26 eliminates signals having frequencies beyond a predetermined frequency band from the digital signals. That is, the LPF 26 only allows passage of received signals within a desired frequency band and eliminates interfering waves outside of the desired frequency band. For example, when the Delta-Sigma ADC 25 converts analog signals to digital signals, there is a possibility to produce an interfering wave. The LPF 26 outputs digital signals from which an interfering wave was eliminated, to the PDG 27.

The PDG 27 amplifies the signal level of the digital signals output from the LPF 26. That is, the PDG 27 amplifies the amplitude of the digital signals output from the LPF 26 up to a predetermined adequate value. The PDG 27 outputs the amplified digital signals to a digital baseband LSI 70 or the like.

The power detecting unit 28 detects signal power of the digital signals output from the PDG 27. Signal power is defined by using a root mean square value of the amplitude of a digital signal. The power detecting unit 28 outputs a value of signal power detected periodically to the gain control unit 29. Alternatively, upon detecting a variation in the signal power of the digital signals, the power detecting unit 28 may notify the gain control unit 29 that a variation in the signal power has occurred.

Depending on signal power notified from the power detecting unit 28, the gain control unit 29 sets an amplification level to which the amplitude of signals which are received by the LNA 21, PGA 23, and PDG 27 should be amplified. The amplification level may also be referred to as gain or "gain setting". For instance, when signal power detected by the power detecting unit 28 is smaller, the gain control unit 29 may set a larger gain setting; when the signal power is larger, it may set a smaller gain setting. The gain control unit 29 outputs a signal $G_{LNA}$ indicating the gain setting to the LNA 21, a signal $G_{PGA}$ indicating the gain setting to the PGA 23, and a signal $G_{PDG}$ indicating the gain setting to the PDG 27. The gain control unit 29 outputs the signals $G_{LNA}$, $G_{PGA}$, and $G_{PDG}$ to the dither signal control unit 30 as well.

When the gain control unit 29 changes the gain setting depending on signal power output from the power detecting unit 28, it outputs a gain_update signal to the dither signal control unit 30. The gain_update signal is used to notify the dither signal control unit 30 of the gain setting change, that is, an amplification level change. For instance, if an increase in the signal power of the digital signals which are output from the PDG 27 is detected, the gain control unit 29 exerts control to decrease the gain settings of the LNA 21, PGA 23, and PDG 27. If a decrease in the signal power of the digital signals which are output from the PDG 27 is detected, the gain control unit 29 exerts control to increase the gain settings. When there is a change in the gain settings, the gain control unit 29 outputs the gain_update signal to the dither signal control unit 30, indicating to the latter that the gain settings are being updated.

The dither signal control unit 30 receives the signals indicating the respective gain settings and the gain_update signal. Then, the dither signal control unit 30 outputs a dither on/off switching control signal that controls whether or not to add the dither signal, based on the signals indicating respective gain settings and the gain_update signal, to the Delta-Sigma ADC 25.

FIG. 1 illustrates the configuration such that the power detecting unit 28 detects the signal power of digital signals which are output from the PDG 27. By this manner of configuration, the circuit configuration can be simplified, since detecting the signal power of digital signals is easier than detecting the signal power of analog signals. However, the placement of the power detecting unit 28 is not limited to that presented in the configuration example of FIG. 1. For example, the power detecting unit 28 may be placed to detect the signal power of analog signals which are output from the LPF 24. Alternatively, the power detecting unit 28 may be placed in some other position. If the power detecting unit 28 is placed to detect the signal power of analog signals, a circuit or the like that detects analog signals is required.

Figure 2:
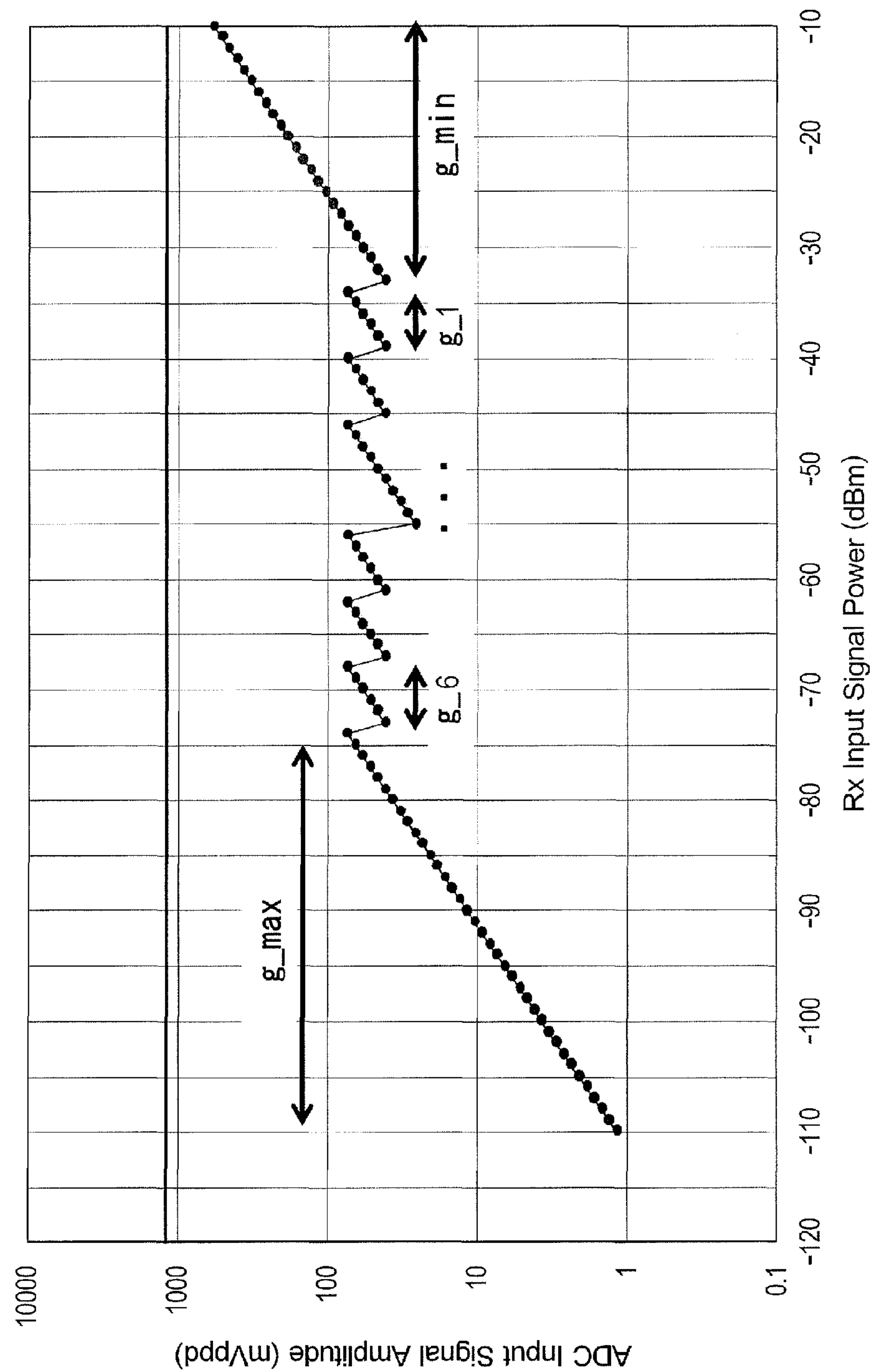
FIG. 2 is a diagram presenting a setting scheme for gain settings, pertaining to the first embodiment.

Here, a setting scheme for gain settings is described using FIG. 2. The ordinate ("y") axis of FIG. 2 indicates the input amplitude of analog signals that are input to the Delta-Sigma ADC 25. The abscissa ("x") axis of FIG. 2 indicates the signal power of radio signals that are input to the RFIC 20. Ideally, it is desired that the input amplitude of analog signals that are input to the Delta-Sigma ADC 25 is substantially constant and does not depend on the signal power of radio signals. However, a range in which the LNA 21 and PGA 23 are able to adjust gain is limited. Therefore, it is hard for the LNA 21 and PGA 23 to maintain the amplitude of analog signals that are input to the Delta-Sigma ADC 25 constant over an entire range of potential signal power of radio signals. For this reason, the amplitude of analog signals that are input to the Delta-Sigma ADC 25 varies.

FIG. 2 shows that the input amplitude of analog signals that are input to the Delta-Sigma ADC 25 decreases in a first region in which the signal power of radio signals is small and the input amplitude of analog signals that are input to the Delta-Sigma ADC 25 increases in a second region in which the signal power of radio signals is large. The region in which the signal power of radio signals is small may be, for example, a region in which the signal power is less than −85 dBm. The region in which the signal power of radio signals is large may be, for example, a region in which the signal power is more than −25 dBm.

In a region in which the signal power of radio signals is less than −75 dBm, g_max is set as the gain setting. In a region in which the signal power of radio signals is more than −30 dBm, g_min is set as the gain setting. In a range between −30 dBm and −75 dBm of the signal power of radio signals, the gain setting becomes gradually larger, from g_1 to g_6, as the signal power decreases. A maximum gain setting is g_max and a minimum gain setting is g_min. The gain setting increases from g_1 to g_6, as the number increments. Steps of gain setting may be finer than g_1 to g_6. Alternatively, steps of gain setting may be coarser than g_1 to g_6, such as two or three steps.

Figure 3:
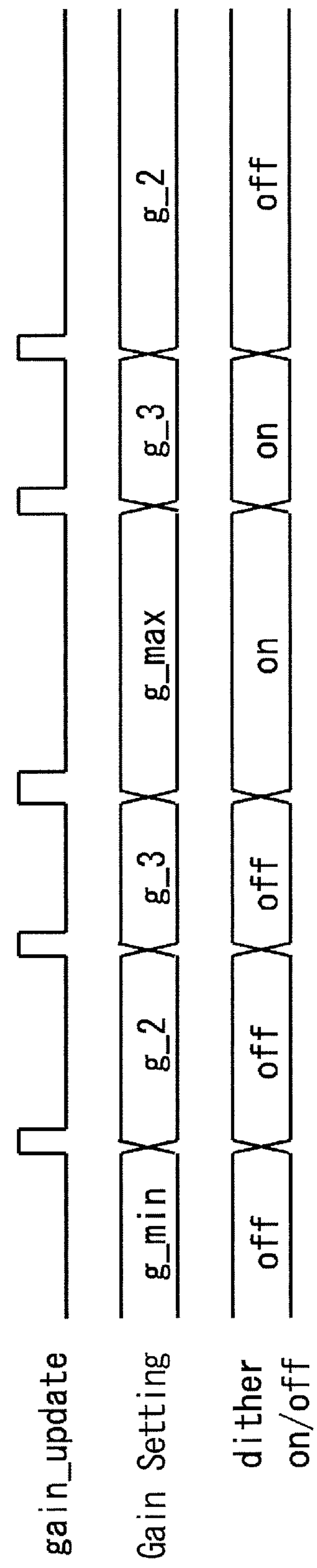
FIG. 3 is a diagram presenting a relation between the gain setting and a dither signal, pertaining to the first embodiment.

Next, a relation between the gain setting and the dither signal is described using FIG. 3. FIG. 3 shows that the dither signal is not added when the gain setting changes in incremental steps from g_min to g__3. That is, the dither signal control unit 30 sets the dither on/off switching control signal OFF and outputs it to the Delta-Sigma ADC 25, even if the gain setting changes in incremental steps from g_min to g__3. However, the dither signal control unit 30 exerts control to add the dither signal, when the gain setting changes from g__3 to g_max. That is, the dither signal control unit 30 sets the dither on/off switching control signal ON and outputs it to the Delta-Sigma ADC 25, when the gain setting changes from g__3 to g_max.

The dither signal control unit 30 also exerts control to add the dither signal when the gain setting has been changed from g_max to g__3. That is, the dither signal control unit 30 keeps the dither on/off switching control signal ON, even if the gain setting changes from g_max to g__3. However, the dither signal control unit 30 exerts control not to add the dither signal, when the gain setting changes from g__3 to g__2. That is, the dither signal control unit 30 sets the dither on/off switching control signal OFF and outputs it to the Delta-Sigma ADC 25, when the gain setting changes from g__3 to g__2.

FIG. 3 also shows that a gain_update signal is sent from the gain control unit 29 to the dither signal control unit 30, whenever there is a change in the gain setting.

As shown in FIG. 3, when the gain setting is set at g__3, the ON/OFF setting of the dither on/off switching control signal differs depending on the immediately preceding gain setting. This manner of control in which, for the same gain setting, the ON/OFF setting of the dither on/off switching control signal differs depending on the preceding gain setting may be referred to as hysteresis control.

Figure 4:
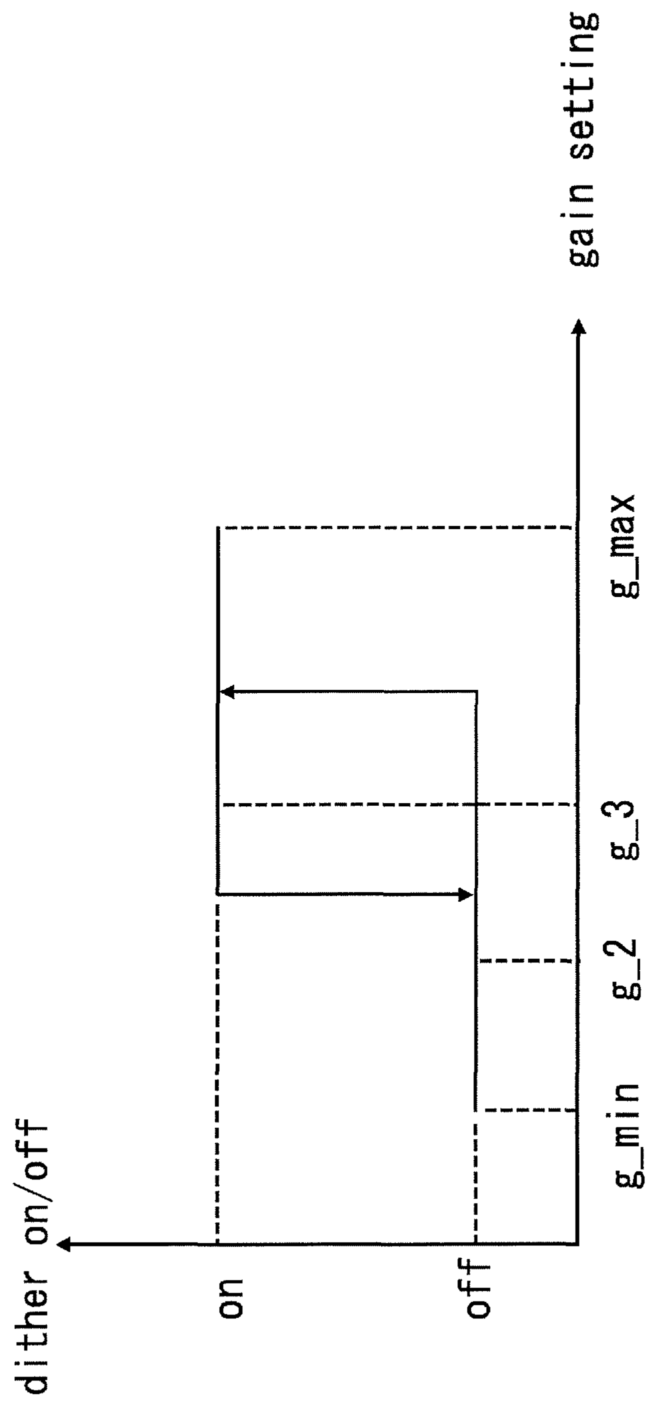
FIG. 4 is a diagram presenting hysteresis control pertaining to the first embodiment.

Then, hysteresis control is described more fully with reference to FIG. 4. When the gain setting is changed from g_min to g__2 or from g__2 to g__3, the dither on/off switching control signal remains OFF. When the gain setting is changed from g__3 to g_max, the dither on/off switching control signal is changed to ON. When the gain setting is changed from g_max to g__3, the dither on/off switching control signal remains ON. However, when the gain setting is changed from g__3 to g__2, the dither on/off switching control signal is changed to OFF.

In this way, when the gain setting is g__3, the dither on/off switching control signal is set ON or OFF depending on whether g__2 or g_max is the gain setting just before the gain setting is changed to g__3. That is, when the gain setting is g__3, the dither on/off switching control signal may have either of two values. By performing hysteresis control in this way, frequent switching of the dither on/off switching control signal in response to gain setting change can be prevented.

FIGS. 3 and 4 show that, when the gain setting is changed from g__3 to g_max, that is, when the signal power of radio signals decreases, the setting of the dither on/off switching control signal is switched ON so that the dither signal is added. FIGS. 3 and 4 also show that, when the gain setting is changed from g_max to g__3, that is, when the signal power of radio signals increases, the setting of the dither on/off switching control signal is not switched and that the ON setting is maintained.

It is understood from FIG. 2 that over the middle region of input signal power, lower input signal powers correspond to higher gain settings. As such, g_max>g__6>g__5>g__4>g__3>g__2>g__1>g_min. In the example discussed above with respect to FIGS. 3 and 4, the dither signal was included (added) when the change in gain setting transitioned from g__3 to g_max and also from g_max to g__3. Thus, in one sense, the dithering signal control unit causes the analog-to-digital converter to include the dither signal in the digital signal if the gain setting change between two values, both of which values are applied only upon detection of signal power lower than a predetermined criterion value (in the given example, the predetermined criterion value corresponds to a signal power low enough to require a gain of no less than g__3). In another sense, the dither signal control unit causes the analog-to-digital converter to include the dither signal in the digital signal only if the gain setting changes between two values, which values are separated by at least two intervening predetermined gain settings (in the given example, three gain settings—g__4, g__5 and g__6—intervene between gains g__3 and g_max, though in other instances a smaller number of intervening gain settings may suffice).

Figure 5:
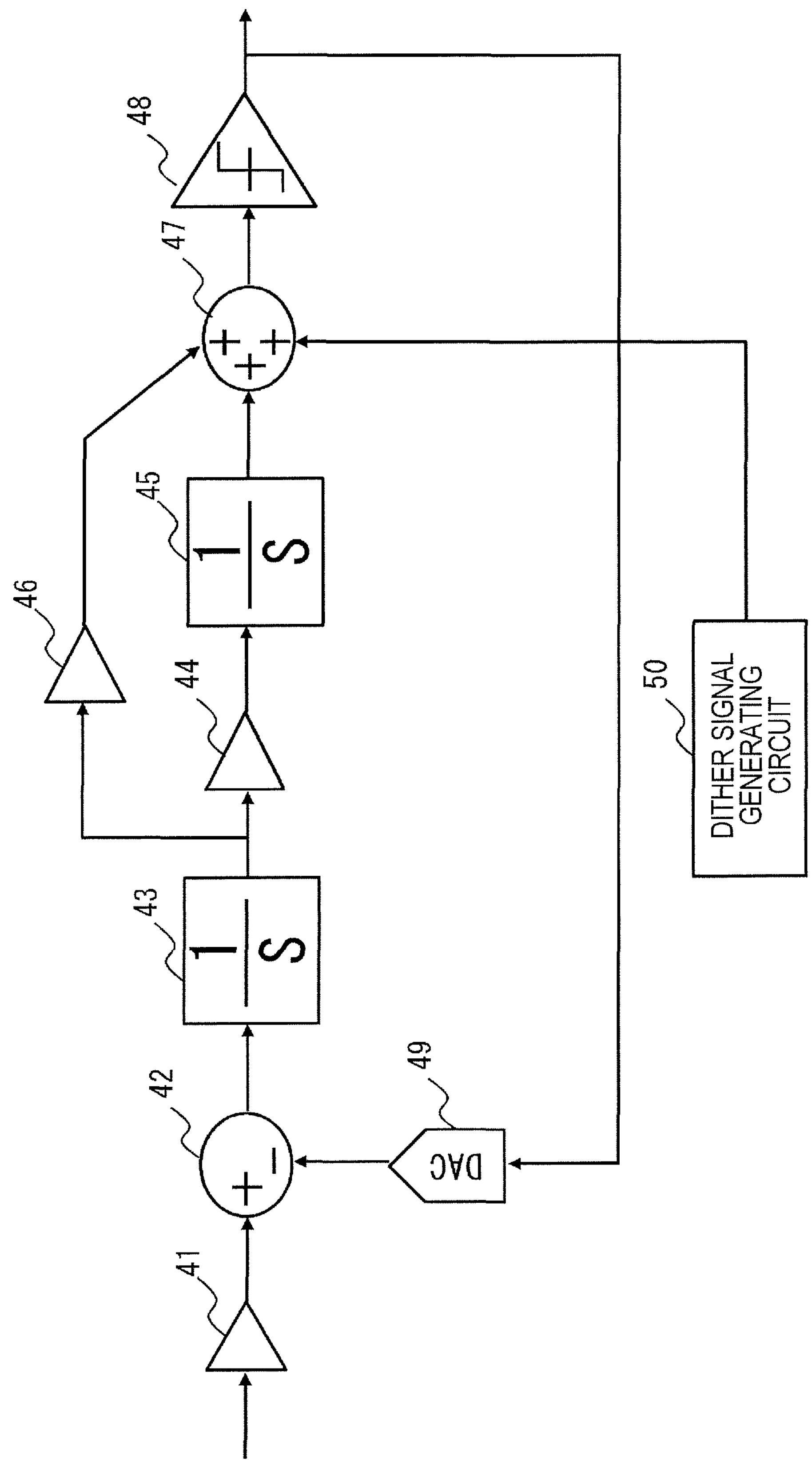
FIG. 5 is a configuration diagram of a Delta-Sigma ADC pertaining to the first embodiment.

A configuration example of the Delta-Sigma ADC 25 is described using FIG. 5. The Delta-Sigma ADC 25 includes a first gain element 41, a first adding element 42, a first integrating element 43, a second gain element 44, a second integrating element 45, a third gain element 46, a second adding element 47, a comparison element 48, a feedback DAC 49, and a dither signal generating circuit 50.

The first gain element 41 amplifies the amplitude of an analog signal that has been input to the Delta-Sigma ADC 25. The first gain element 41 outputs an analog signal with its amplitude amplified, to the first adding element 42. The first adding element 42 adds an analog signal output from the first gain element 41 and an analog signal output from the feedback DAC 49 and outputs an addition result signal to the first integrating element 43. The feedback DAC 49 receives a digital signal which is output from the comparison element 48 as a feedback signal. The feedback DAC 49 converts the received digital signal to an analog signal and outputs it to the first adding element 42. By outputting a digital signal which is output from the comparison element 48 to the first adding element 42 as a feedback signal, it is possible to reduce a quantization error.

The first integrating element 43 integrates an analog signal output from the first adding element 42. The first integrating element 43 outputs a signal representing a first integration result to both the second gain element 44 and the third gain element 46. The second gain element 44 and the third gain element 46 amplify the amplitude of the signal output from the first integrating element 43. The second gain element 44 outputs a signal with its amplitude amplified to the second integrating element 45. The second integrating element 45 integrates an analog signal output from the second gain element 44. The second integrating element 45 outputs a signal representing a second integration result to the second adding element 47. The second adding element 47 adds a signal which is output from the third gain element 46 and a signal which is output from the second integrating element 45.

To these signals, the second adding element 47 further adds the dither signal generated by the dither signal generating circuit 50. The second adding element 47 outputs a second addition result signal to the comparison element 48. The comparison element 48 quantizes the signal output from the second adding element 47 and outputs a digital signal. The digital signal that is output from the comparison element 48 is output to the first adding element 42 via the feedback DAC 49 as a feedback signal.

The dither signal generating circuit 50 generates and outputs the dither signal to the second adding element 47. The dither signal generating circuit 50 generates the dither signal according to the ON/OFF setting of a dither on/off switching control signal which is output from the dither control unit 30. For example, if the dither on/off switching control signal is set to ON, the dither signal control unit 30 generates the dither signal. If the dither on/off switching control signal is set to OFF the dither signal control unit 30 does not generate the dither signal.

Figure 6:
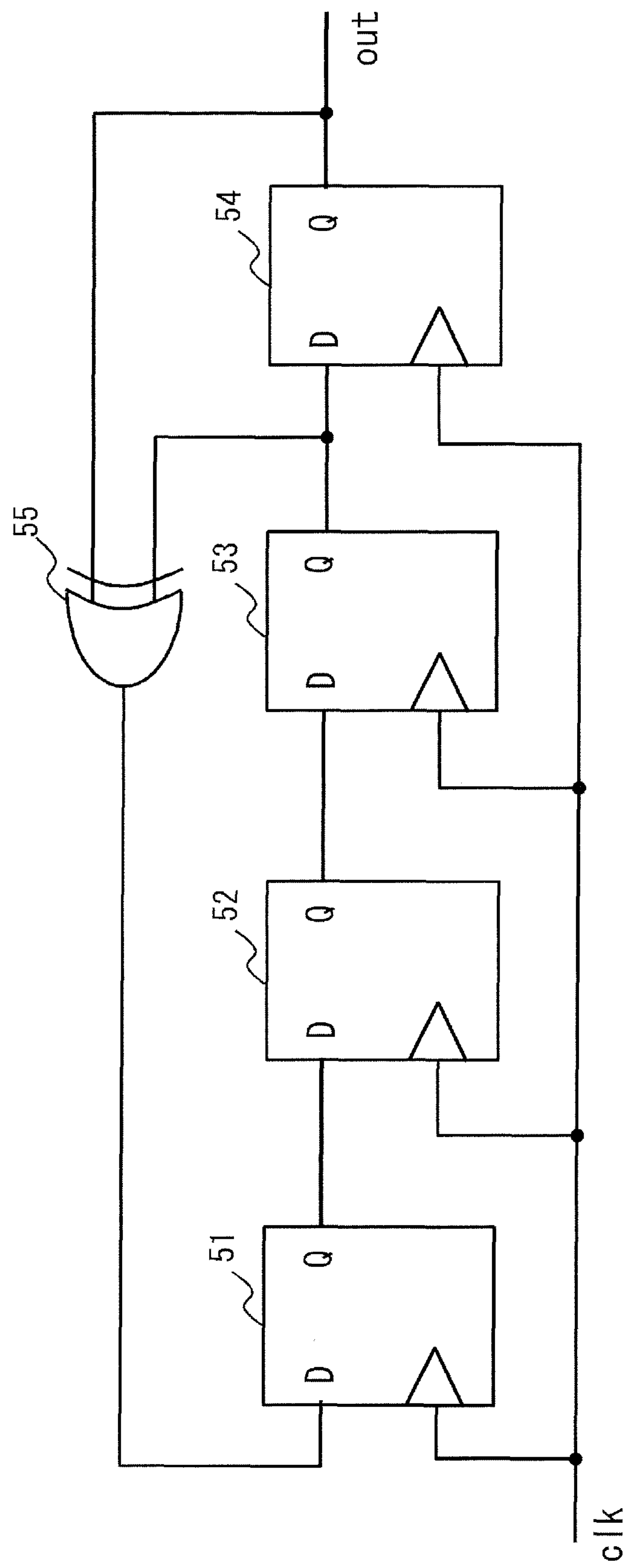
FIG. 6 is a configuration diagram of a dither signal generating circuit pertaining to the first embodiment.

Next, a configuration example of the dither signal generating circuit 50 is described using FIG. 6. The dither signal generating circuit 50 includes flip-flop circuits 51 to 54 and an XOR arithmetic circuit 55. The flip-flop circuits 51 to 54 operate according to a CLK signal that is input thereto. The dither signal generating circuit 50 outputs a 4-bit random signal pattern by utilizing the flip-flop circuits 51 to 54 and the XOR arithmetic circuit 55. The second adding element 47 adds the dither signal that is a random signal pattern to signals output from the second integrating element 45 and the third gain element 46.

The dither signal generating circuit 50 is not limited to the configuration presented in FIG. 6 and may instead be some other circuit configured to generate a random signal pattern.

As described hereinbefore, through the use of the semiconductor device pertaining to the first embodiment, the Delta-Sigma ADC 25 can add the dither signal when the gain setting changes. When the gain setting changes, the RFIC 20 is placed in a transition state for applying a new gain setting. Therefore, the RFIC 20 invalidates radio signals received during the transition state. Or, in a case when the RFIC 20 performs routine signal processing on radio signals received during the transition state, the receiving characteristic for the radio signals will deteriorate. Even if the dither signal is added when radio signals are invalidated or during signal processing when the receiving characteristic for radio signals deteriorates, as above, it does not produce such an adverse influence that the receiving characteristic for radio signals is deteriorated. In other words, it is possible for the RFIC 20 to add the dither signal without influence on the receiving characteristic.

Second Embodiment

Figure 7:
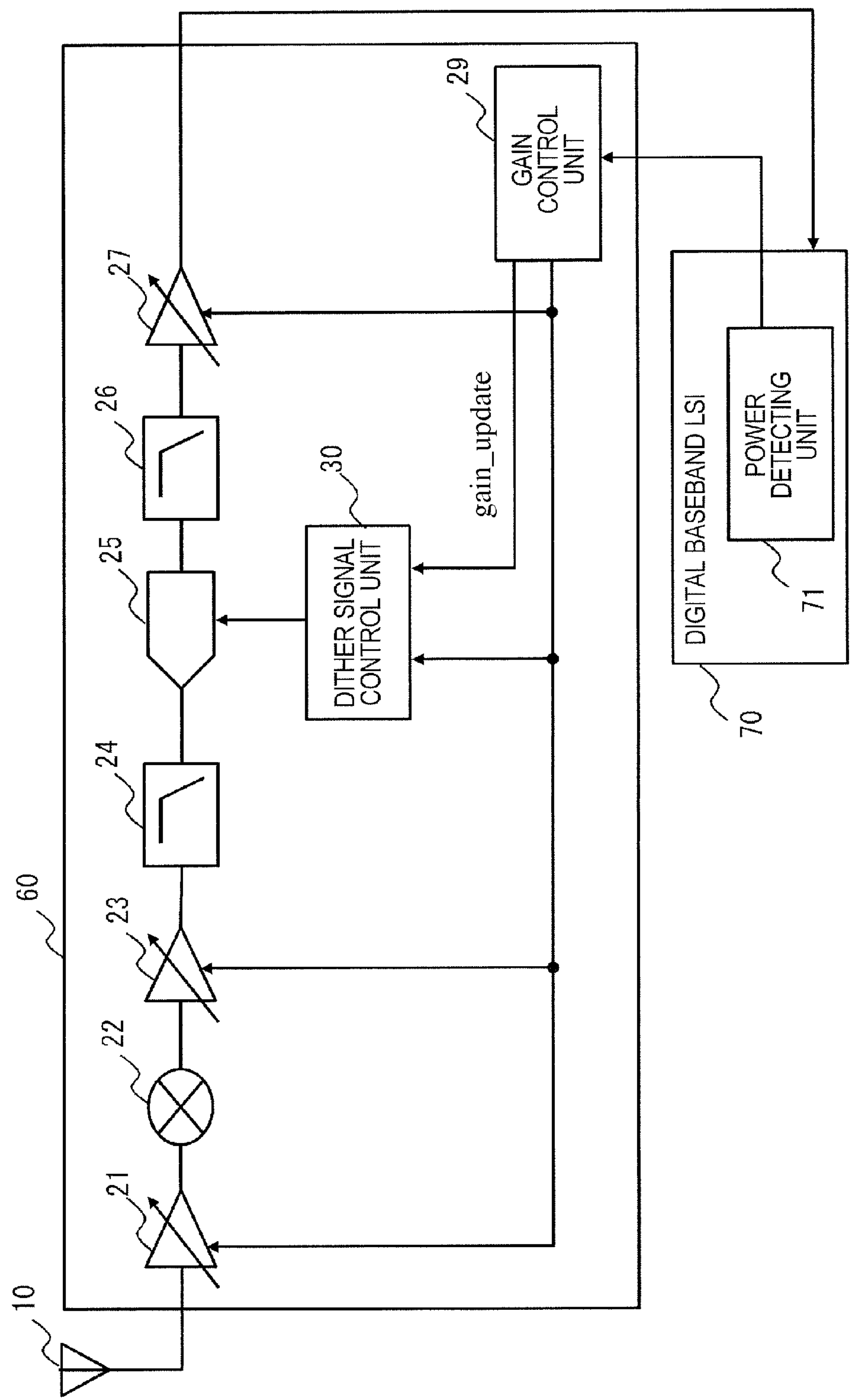
FIG. 7 is a configuration diagram of an RFIC and a digital baseband LSI pertaining to a second embodiment.

Next, a configuration example of an RFIC 60 and a digital baseband LSI 70, which is a peripheral device, pertaining to a second embodiment is described using FIG. 7. The RFIC 60 in FIG. 7 has the same configuration as in FIG. 1 except that it does not include the power detecting unit 28. As for the same components as in FIG. 1, their description is dispensed with.

The digital baseband LSI 70 is a circuit for signal processing of digital signals that are output from the RFIC 60. In FIG. 7, the digital baseband LSI 70 includes a power detecting unit 71. That is, the power detecting unit 71 in the digital baseband LSI 70 detects signal power of digital signals that are output from the RFIC 60, and so the power detecting unit 71 is external to the RFIC 60. The power detecting unit 71 outputs detected signal power to the gain control unit 29 in the RFIC 20.

The gain control unit 29 performs control of an amplification level depending on the detected signal power output from the power detecting unit 71. Control of an amplification level, that is, control of the gain setting is implemented in the same way as is the case for the first embodiment.

As described above, through the use of the RFIC 60 and the digital baseband LSI 70 pertaining to the second embodiment, the RFIC 60 can obtain information on signal power from a device external to the RFIC 60, when the power detecting unit 28 is not disposed in the RFIC 60. Thereby, the circuit area of the RFIC 60 becomes smaller than that of the RFIC 20 presented in FIG. 1, because the power detecting unit 28 is not disposed in the RFIC 60 and its circuit configuration can be simplified.

While the invention made by the present inventors has been described specifically based on its embodiments hereinbefore, it will be obvious that the present invention is not limited to the described embodiments and various modifications may be made without departing from the scope of the invention.

What is claimed is:

1. A semiconductor communication device comprising:

an analog-to-digital converter that converts input analog signals to digital signals;

a gain control unit that changes a gain setting of analog signals to be input to the analog-to-digital converter, depending on a signal power of the input analog signals; and a dither signal control unit that causes the analog-to-digital converter to selectively add a dither signal when the gain setting changes.

2. The semiconductor device according to claim 1, wherein the gain control unit outputs a gain update signal to the dither signal control unit, when changing the gain setting, and wherein the dither signal control unit, in response to the gain update signal, outputs a dither on/off switching control signal to the analog-to-digital converter to cause the analog-to-digital converter to add the dither signal.

3. The semiconductor device according to claim 2, wherein the dither signal control unit causes the analog-to-digital converter to add a dither signal, if the gain setting changes to a value that is applied only upon detection of signal power lower than a predetermined criterion value.

4. The semiconductor device according to claim 1, wherein, when the gain setting is changed to a new value, the dither signal control unit determines whether or not to cause the analog-to-digital converter to add the dither signal, based on the gain setting just before the change.

5. The semiconductor device according to claim 4, wherein, for a given gain setting, the dither signal control unit can behave in either of two ways: one in which it causes the analog-to-digital converter to be in a first state in which the dither signal is not added, and another in which it causes the analog-to-digital converter to be in a second state in which the dither signal is added.

6. The semiconductor device according to claim 5, wherein, when the analog-to-digital converter is in the first state, if a change from a first gain setting to a second gain setting occurs in response to a decrease in signal power, the dither signal control unit causes the analog-to-digital converter to enter the second state and add the dither signal, and wherein, when the analog-to-digital converter is in the second state, if a change from the second gain setting to the first gain setting occurs in response to an increase in signal power, the dither signal control unit causes the analog-to-digital converter to remain in the second state and continue to add the dither signal.

7. The semiconductor device according to claim 1, further comprising a power detecting unit configured to detect a signal power depending on the digital signals which are output from the analog-to-digital converter.

8. A communication apparatus comprising a first semiconductor device and second semiconductor device, wherein the first semiconductor device comprises:

an analog-to-digital converter that converts input analog signals to digital signals;

a gain control unit that changes a gain setting of analog signals to be input to the analog-to-digital converter, depending on a signal power of the input analog signals; and a dither signal control unit that causes the analog-to-digital converter to selectively add a dither signal when the gain setting changes, and wherein the second semiconductor device comprises:

a digital baseband circuit including a power detecting unit that detects a signal power of an output digital signal from the first semiconductor device.

9. The communication apparatus according to claim 8, wherein the gain control unit outputs a gain update signal to the dither signal control unit, when changing the gain setting, and wherein the dither signal control unit, in response to the gain update signal, outputs a dither on/off switching control signal to the analog-to-digital converter to cause the analog-to-digital converter to add the dither signal.

10. The communication apparatus according to claim 9, wherein the dither signal control unit causes the analog-to-digital converter to add a dither signal, if the gain setting changes to a value that is applied only upon detection of signal power lower than a predetermined criterion value.

11. The communication apparatus according to claim 8, wherein, when the gain setting is changed to a new value, the dither signal control unit determines whether or not to cause the analog-to-digital converter to add the dither signal, based on the gain setting just before the change.

12. The communication apparatus according to claim 11, wherein, for a given gain setting, the dither signal control unit can behave in either of two ways: one in which it causes the analog-to-digital converter to be in a lint state in which the dither signal is not added, and another in which it causes the analog-to-digital converter to be in a second state in which the dither signal is added.

13. The communication apparatus according to claim 12, wherein, when the analog-to-digital converter is in the first state, if a change from a first gain setting to a second gain setting occurs in response to a decrease in signal power, the dither signal control unit causes the analog-to-digital converter to enter the second state and add the dither signal, and wherein, when the analog-to-digital converter is in the second state, if a change from the second gain setting to the first gain setting occurs in response to an increase in signal power, the dither signal control unit causes the analog-to-digital converter to remain in the second state and continue to add the dither signal.

* * * * *